US008169126B2

(12) United States Patent
Shiba

(10) Patent No.: US 8,169,126 B2
(45) Date of Patent: May 1, 2012

(54) LOW FREQUENCY OSCILLATOR, THE OMNI-DIRECTIONAL TYPE LOW FREQUENCY UNDERWATER ACOUSTIC TRANSDUCER USING THE SAME AND THE CYLINDRICAL RADIATION TYPE LOW FREQUENCY UNDERWATER ACOUSTIC TRANSDUCER USING THE SAME

(75) Inventor: Hiroshi Shiba, Tokyo (JP)

(73) Assignee: NEC Corporation, Tokyo (JP)

( * ) Notice: Subject to any disclaimer, the term of this patent is extended or adjusted under 35 U.S.C. 154(b) by 356 days.

(21) Appl. No.: 12/403,898

(22) Filed: Mar. 13, 2009

(65) Prior Publication Data

US 2009/0236937 A1 Sep. 24, 2009

(30) Foreign Application Priority Data

Mar. 21, 2008 (JP) .................................. 2008-73604

(51) Int. Cl.
*H01L 41/053* (2006.01)

(52) U.S. Cl. ........................................ 310/334; 310/348

(58) Field of Classification Search .................. 310/322, 310/324, 334, 335, 344, 348
See application file for complete search history.

(56) References Cited

U.S. PATENT DOCUMENTS 3,749,948 A * 7/1973 Morris .......................... 310/326
5,804,906 A * 9/1998 Tsutsumi ...................... 310/322

FOREIGN PATENT DOCUMENTS

JP 1991011898 A 1/1991
JP 3520837 B 4/2004

* cited by examiner

*Primary Examiner* — Derek Rosenau

(57) ABSTRACT

A low frequency oscillator includes a plurality of drum-shaped oscillators. Each of the drum-shaped oscillators is constructed so that a pair of disk-shaped flexural vibrators is attached on both open ends of a conductive cylinder so as to be arranged face to face. And a conductive elongated coupling member is fixed to adjacent the drum-shaped oscillators at a central portion thereof so as to electrically connect between adjacent the disk-shaped flexural vibrators and thereby coupling the drum-shaped oscillators along a central axis thereof.

4 Claims, 11 Drawing Sheets

LOW FREQUENCY OSCILLATOR, THE OMNI-DIRECTIONAL TYPE LOW FREQUENCY UNDERWATER ACOUSTIC TRANSDUCER USING THE SAME AND THE CYLINDRICAL RADIATION TYPE LOW FREQUENCY UNDERWATER ACOUSTIC TRANSDUCER USING THE SAME

This application is based upon and claims the benefit of priority from Japanese patent application No. 2008-073604, filed on Mar. 21, 2008 and the disclosure of which is incorporated herein in its entirety by reference.

1. TECHNICAL FIELD

The present invention relates to a transducer of a sound wave for underwater and relates to an omni-directional type low frequency underwater acoustic transducer and a cylindrical radiation type low frequency underwater acoustic transducer using the low frequency oscillator having a disk-shaped flexural vibrator.

2. BACKGROUND ART

Recently, in a field of an oceanographic survey, a sound wave having low frequency is often used because of low attenuation and good propagation characteristic in water, and thus various low frequency transducers are realized for a practical use.

For example, Japanese Patent Application Laid-Open No. Hei-3 (1991)-11898 (patent document 1: refer to page 3, FIG. 1 and FIG. 3) shows a transducer where a metal cylindrical body is provided with a plurality of slits elongated in an axial direction thereof to form a plurality of vibrating plates, and a piezoelectric vibrator is bonded on either inside or outside of each of the vibrating plates. By using thin plate-shaped vibrating plates, a frequency of a sound wave is lowered.

Other bending vibration type acoustic transducer is disclosed in Japanese Patent Gazette No. 3520837 (patent document 2). In this bending vibration type acoustic transducer, a cylindrical vibrator is formed of laminated and combined vibrator pieces. The cylindrical vibrator includes a plurality of side-face vibrating plates (first vibrating plates for sound wave emission) and end-face vibrating plates (second vibrating plates for sound wave emission). A plurality of slits formed in an axial direction of a cylindrical metal plate form the side-face vibrating plates therein. In the bending vibration type acoustic transducer, the cylindrical vibrators vibrate in response to applied voltage signal. The side-face vibrating plates and the end-face vibrating plates perform bending vibration to generate a sound wave. Since two kinds of vibrating plates, the side-face vibrating plates and the end-face vibrating plates, are used as vibrating plates for sound wave emission, a frequency of a sound wave is lowered and a frequency band is broadened.

A transducer which radiates a sound wave in water and receives the sound wave in water uses an oscillator utilizing a structure of mechanical resonance so as to efficiently transmit the sound wave. Generally, mechanical structure tends to decrease its mechanical resonance frequency when its size is large. Thus, in order to form a transducer for low frequency, large mechanical size is inevitably needed. Accordingly, in the transducer for the low frequency, the miniaturization and the weight saving are always required, and the realization of a vibrator or oscillator which has a small size with lowered mechanical resonance is a technical issues.

Because a thin plate such as metal plate has low elasticity, its resonance frequency can be made low, thus a conventional transducer for low frequencies employs a plate-shaped vibrator which uses the thin plate as a vibrating plate so as to be a simple structure with small size and light-weight transducer. In the transducers described in the patent documents 1 and 2, the above-mentioned vibrating plate is used to lower the frequency of a sound wave.

However, the resonance frequency of the plate-shaped vibrator using the vibrating plate is determined by a length of long side and thickness thereof in the case of the rectangular plate type, or it is determined by the diameter of the disk and thickness of the vibrating plate in the case of the disk type. Accordingly, in order to aim at further lowering frequency of the transducer using the vibrating plate, thickness of the vibrating plate must be made thin theoretically or make its size large. However, in view of the strength of the whole vibrating plate, its production method is limited. Therefore, the size of the vibrating plate has to be made large. Even if the vibrating plate is used, in order to aim at further lowering its frequency, the transducer's size tends to become large and its weight is also increased, and thus causing such problems as difficulty for achieving small size and light-weight for the transducer.

SUMMARY

An exemplary object of the present invention is to provide a low frequency oscillator enabling low frequency operation with small size and light-weight, and to provide an omni-directional type low frequency underwater acoustic transducer using the above-mentioned oscillator, and a cylindrical radiation type low frequency underwater acoustic oscillator.

A low frequency oscillator according to an exemplary aspect of the present invention includes a plurality of drum-shaped oscillators. Each of the drum-shaped oscillators is constructed so that a pair of disk-shaped flexural vibrators is attached on both open ends of a conductive cylinder so as to be arranged face to face. And a conductive elongated coupling member is fixed to adjacent drum-shaped oscillators at a central portion thereof so as to electrically connect between adjacent disk-shaped flexural vibrators and thereby mechanically coupling the drum-shaped oscillators along a central axis thereof.

An omni-directional type low frequency underwater acoustic transducer according to an exemplary aspect of the present invention includes the above-mentioned low frequency oscillator, i.e., a plurality of drum-shaped oscillators, each of which is constructed so that a pair of disk-shaped flexural vibrators is attached on both open ends of a conductive cylinder so as to be arranged face to face. And a conductive elongated coupling member is fixed to adjacent drum-shaped oscillators at a central portion thereof so as to electrically connect between adjacent disk-shaped flexural vibrators and thereby mechanically coupling the drum-shaped oscillators along a central axis thereof. And further including an elastic sliding ring attached to an annular groove formed on an outer wall of the conductive cylinder which is arranged outer most positions of the coupling array of the drum-shaped oscillators. The coupling array of the drum-shaped oscillators is housed in a cylindrical case coaxially, which has an inner wall fitted to the elastic sliding ring so as to seal a space formed among the cylindrical case and the drum-shaped oscillators. Further, a pair of acoustic elastic and stretchable covers is attached to both open ends of the cylindrical case so as to provide a pair of sealed spaces, and insulating oil is filled in each of the sealed spaces.

The cylindrical radiation type low frequency underwater acoustic transducer according to an exemplary aspect of the present invention includes the above-mentioned low frequency oscillator, i.e., a plurality of drum-shaped oscillators, each of which is constructed so that a pair of disk-shaped flexural vibrators is attached on both open ends of a conductive cylinder so as to be arranged face to face. And a conductive elongated coupling member is fixed to adjacent drum-shaped oscillators at a central portion thereof so as to electrically connect between adjacent disk-shaped flexural vibrators and thereby mechanically coupling the drum-shaped oscillators along a central axis thereof. And further including an elastic sliding ring attached to an annular groove formed on an outer wall of the conductive cylinder which is arranged outer most positions of the coupling array of the drum-shaped oscillators. The pair of the drum-shaped oscillators arranged outer most positions of the coupling array of the drum-shaped oscillators are respectively housed in a pair of cylindrical cases coaxially. Each of the cylindrical cases has an inner wall so as to be fitted to the elastic sliding ring so that the drum-shaped oscillators having the elastic sliding ring is enabled to slide within the cylindrical case without breaking sealing therebetween. In addition, a cylindrical acoustic elastic and stretchable cover is attached to opposing open ends of the pair of cylindrical cases so as to provide a sealed space therein and thereby covering the coupling array of the drum-shaped oscillators, and insulating oil is filled in the sealed space.

BRIEF DESCRIPTION OF THE DRAWINGS

Exemplary features and advantages of the present invention will become apparent from the following detailed description when taken with the accompanying drawings in which.

EXEMPLARY EMBODIMENTS

A low frequency oscillator which is an exemplary embodiment of the present invention, an omni-directional type low frequency underwater acoustic transducer (hereinafter referred to an omni-directional type transducer) using the low frequency oscillator, and a cylindrical radiation type low frequency underwater acoustic transducer (hereinafter referred to a cylindrical radiation type transducer) using the low frequency oscillator will be described in detail in the following, referring to drawings appropriately. The drawings are simply referred to describe the low frequency oscillator, the omni-directional type transducer and the cylindrical radiation type transducer of exemplary embodiments, and dimensions of each illustrated part is not identical to an actual dimensions such as thickness and size of each members.

[Exemplary Embodiment of a Low Frequency Oscillator]

The low frequency oscillator 1 of this exemplary embodiment will be described in detail in the following by referring to FIG. 1 through FIG. 5.

Figure 1:
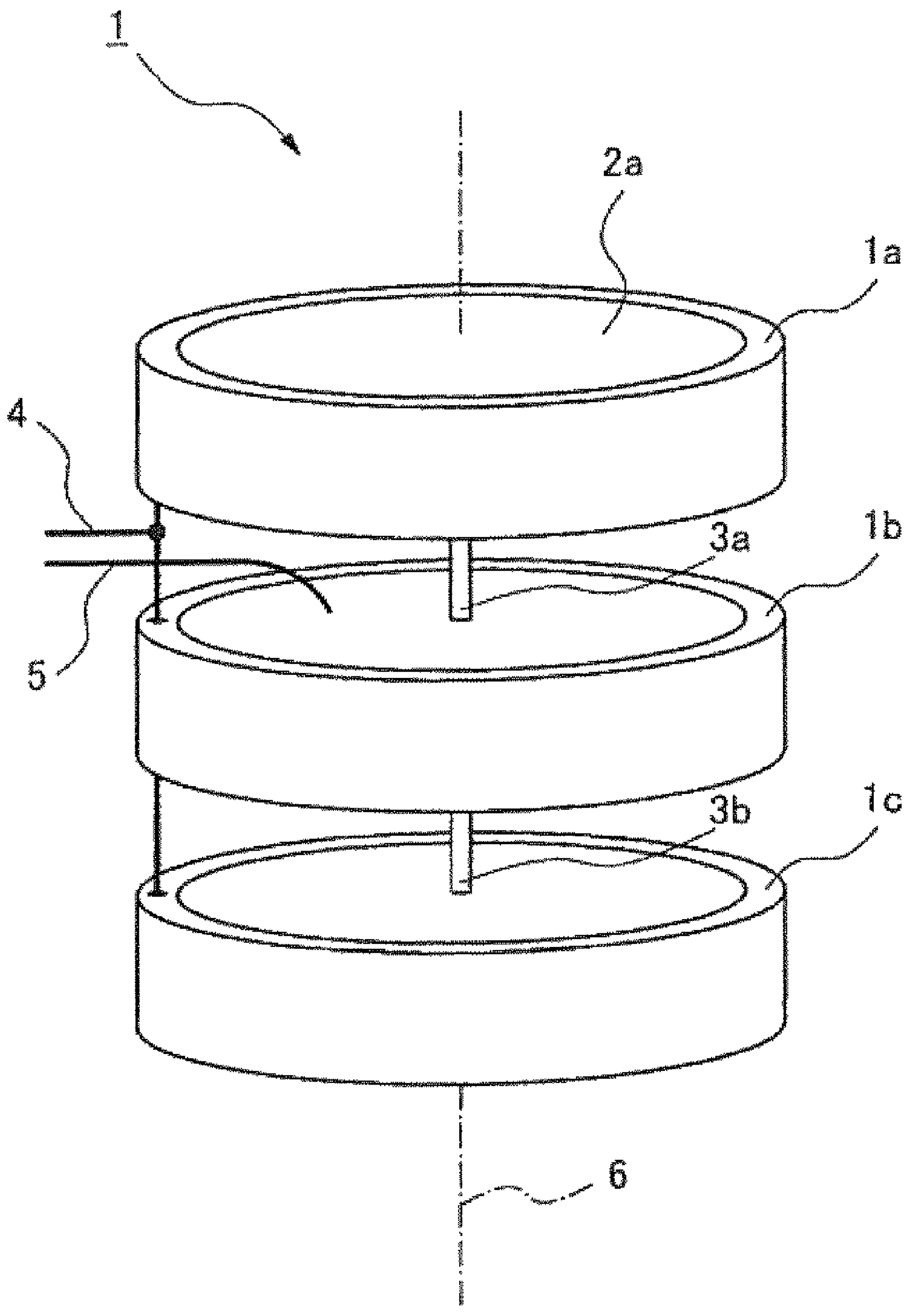
FIG. 1 is a schematic perspective view showing a low frequency oscillator according to an exemplary embodiment of the present invention.
Figure 2:
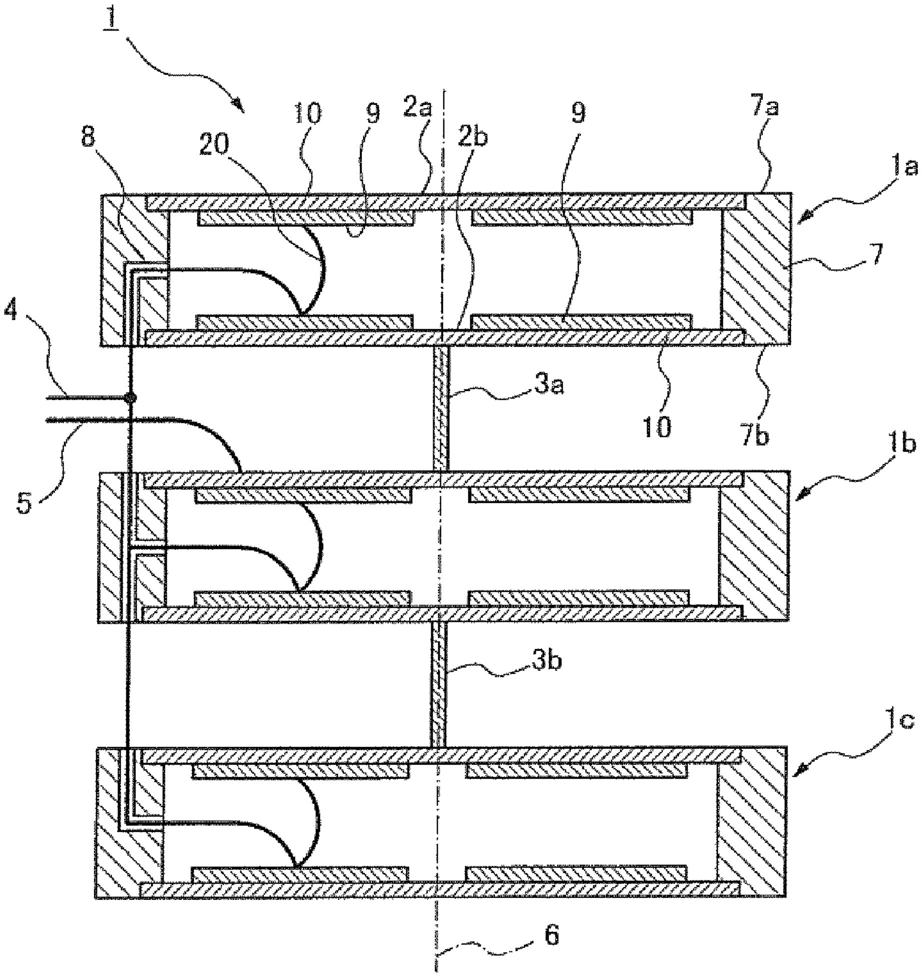
FIG. 2 is a cross sectional view showing an internal structure of the low frequency oscillator according to an exemplary embodiment of the present invention.
Figure 3:
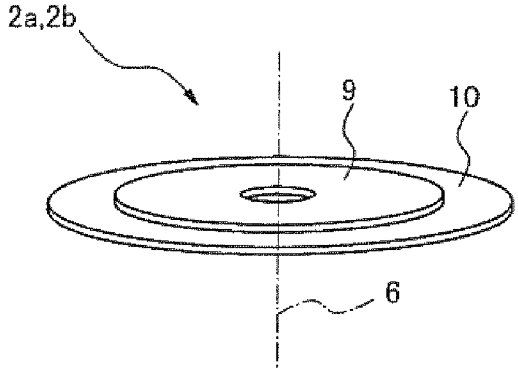
FIG. 3 is a schematic perspective view showing a circular disk-shaped flexural vibrator used for the low frequency oscillator according to an exemplary embodiment of the present invention.
Figure 4C:
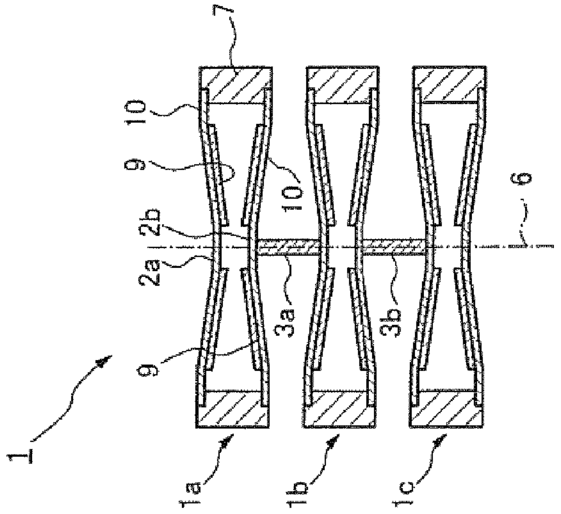
FIG. 4C is a schematic cross sectional view showing a state of the low frequency oscillator shown in FIG. 4A when a voltage applied to a signal line thereof is negative.
Figure 4B:
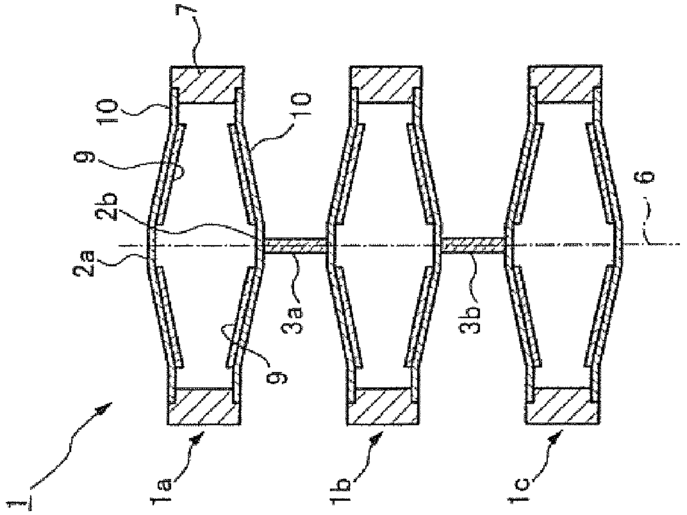
FIG. 4B is a schematic cross sectional view showing a state of the low frequency oscillator shown in FIG. 4A when a voltage applied to a signal line thereof is positive.
Figure 4A:
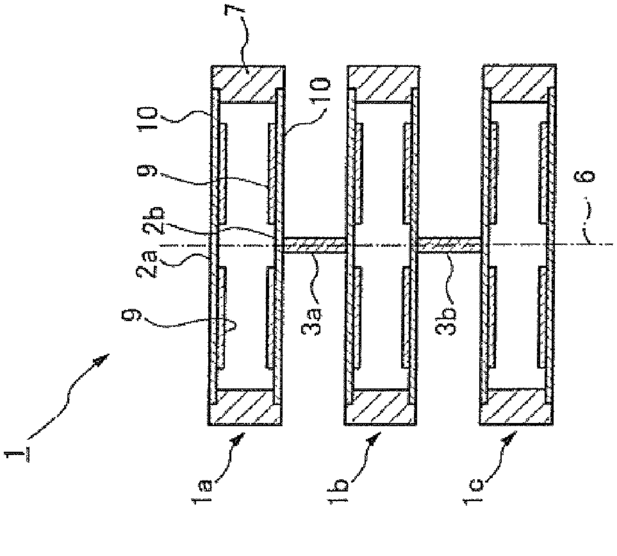
FIG. 4A is a schematic cross sectional view showing a state of a low frequency oscillator according to an exemplary embodiment of the present invention when a voltage applied a signal line thereof is zero.

FIG. 1 is a perspective view of a low frequency oscillator which is a basic element for the present invention, and FIG. 2 is a cross sectional view showing a cut plane at a center axis of FIG. 1 to clear an internal structure of the low frequency oscillator. FIG. 3 is a perspective view of a cylindrical disk-shaped flexural vibrator used for the low frequency oscillator. FIG. 4A through FIG. 4C are cross sectional views for describing operation of the low frequency oscillator according to the exemplary embodiment of the present invention. FIG. 5A through FIG. 5E are schematic diagrams describing a principle of a low frequency oscillator according to an exemplary embodiment of the present invention.

The low frequency oscillator 1 according to an exemplary embodiment of the present invention includes a plurality of drum-shaped oscillators 1*a*, 1*b* and 1*c*. Each of the drum-shaped oscillators 1*a*, 1*b* and 1*c* is constructed so that a pair of disk-shaped flexural vibrators 2*a* and 2*b* are attached on both open ends of a electrically conductive or metallic cylinder 7 so as to be arranged face to face. Each of the disk-shaped flexural vibrators 2*a* and 2*b* is constructed so that a doughnut-shaped thin plate piezoelectric vibrator 9 and a metal disk 10 are bonded together coaxially. And a conductive elongated coupling members such as a metallic wire-like or rod-like coupling members 3*a* and 3*b* are fixed to adjacent drum-shaped oscillators 1*a*, 1*b* and 1*c* at a central portion thereof so as to electrically connect between adjacent disk-shaped flexural vibrators 2*a* and 2*b* and thereby coupling the drum-shaped oscillators 1*a*, 1*b* and 1*c* along a central axis 6 thereof.

The low frequency oscillator 1 shown in FIG. 1 uses the three drum-shaped oscillators 1*a*, 1*b* and 1*c*. The drum-shaped oscillator 1*a* and the drum-shaped oscillator 1*b* are electrically and mechanically connected each other by using a conductive elongated coupling member such as a metallic wire-like or rod-like coupling member 3*a*, while the drum-shaped oscillator 1*b* and the drum-shaped oscillator 1*c* are electrically and mechanically connected each other by using another conductive elongated coupling member such as a metallic wire-like or rod-like coupling member 3*b*. As a result, the drum-shaped oscillators 1*a*, 1*b* and 1*c* are constructed so as to form a coupling array of the drum-shaped oscillators along the center axis 6 (refer to FIG. 2).

As shown in FIG. 2, a drum-shaped oscillator 1*a* is provided with a pair of cylindrical disk-shaped flexural vibrators 2*a* and 2*b* shown in FIG. 3 on an upper open end 7*a* and a bottom open end 7*b* of a conductive cylinder or metallic cylinder 7, respectively. The disk-shaped flexural vibrators 2*a* and 2*b* are arranged such that each doughnut-shaped thin plate piezoelectric vibrator 9 is opposed each other within the metallic cylinder 7. The drum-shaped oscillator 1*b* and the drum-shaped oscillator 1*c* have the same structure of the drum-shaped oscillator 1*a*. These three drum-shaped oscillators 1*a*, 1*b* and 1*c* are mechanically and electrically coupled each other by using the coupling members 3*a* and 3*b* such that each of the connecting members 3*a* and 3*b* is located at a center portion of each drum-shaped oscillator so as to be elongated along a center axis 6.

As shown in FIG. 3, a conductive disk or a metal disk 10 and the doughnut-shaped thin plate piezoelectric vibrator 9 are bonded together coaxially with its center axis 6 to provide each of the cylindrical disk-shaped flexural vibrators 2*a* and 2*b*.

Although a detailed illustration is omitted in FIG. 3, an open-ended side surface of the piezoelectric vibrator 9 is treated as a positive electrode while the opposite side surface faced to the metal disk 10 is treated as a negative electrode. And the negative electrode of the piezoelectric vibrator 9 and the metal disk 10 are electrically connected.

As shown in FIG. 2, the cylindrical disk-shaped flexural vibrators 2*a* and 2*b* of the drum-shaped oscillator 1*a* are arranged so that its open-ended side surfaces (the positive electrodes) of the piezoelectric vibrators 9 are opposed to each other. The opposing open-ended side surfaces are electrically connected by using a lead wire 20 and connected to a signal line 4 through a hole 8 formed in the metallic cylinder 7 for pulling out the signal line. This signal line 4 is also connected to the open-ended side surfaces of the piezoelectric vibrator 9 of the other drum-shaped oscillator 1*b* and 1*c*.

On the other hand, a pair of the metal disks 10 as the negative electrodes is supported by the ends of the metal cylinder 7 in each of the drum-shaped oscillators 1*a*, 1*b* and 1*c* such that each of the negative electrodes of the piezoelectric vibrators 9 can be electrically connected to an external electrode easily. For example, as shown in FIG. 2, two the coupling members 3*a* and 3*b* can be used to electrically connect between adjacent negative electrodes of the piezoelectric vibrators 9. By connecting the ground line 5 to the metal disk 10 of the drum-shaped oscillator 1*b* as shown in FIG. 2, all of the negative electrodes of the piezoelectric vibrators 9 of the drum-shaped oscillators 1*a*, 1*b* and 1*c* are electrically connected to the ground line 5 via the metal cylinders 7 and the connecting members 3*a* and 3*b*.

The operation of the low frequency oscillator 1 having the structure mentioned above will be described based on the schematic diagram illustrated in FIG. 4 (also refer to FIG. 2 and FIG. 3). FIG. 4A is the schematic cross sectional view showing a state of the low frequency oscillator 1 when the voltage applied to the signal line 4 is zero, FIG. 4B shows the state when the applied voltage to the signal line 4 is positive and FIG. 4C shows the state when the applied voltage is negative.

As shown in FIG. 4B, because the positive voltage is applied to each of the drum-shaped oscillators 1*a*, 1*b* and 1*c*, the diameter of the piezoelectric vibrator 9 is increased and thus the shape of each of the drum-shaped oscillators 1*a*, 1*b* and 1*c* turn into a convex shape. On the other hand, in FIG. 4C, because the negative voltage is applied to each of the drum-shaped oscillators 1*a*, 1*b* and 1*c*, the diameter of the piezoelectric vibrator 9 is decreased and thus the shape of each of the drum-shaped oscillators 1*a*, 1*b* and 1*c* turn into a concave shape.

Thus, when the applied voltage to the signal line 4 is zero, as shown in FIG. 4A, the shape change does not produced to the low frequency oscillator 1. On the other hand, as shown in FIG. 4B, when the positive voltage is applied, the whole of the low frequency oscillator 1 expands in the axial direction of the center axis 6. As shown in FIG. 4C, when the negative voltage is applied, the whole of the low frequency oscillator 1 shrinks in the axial direction of the center axis 6. Thus, the transformable operation of the low frequency oscillator 1 is performed in response to the voltage applied to the signal line 4.

Next, the resonance frequency of the low frequency oscillator 1 will be described based on the schematic diagram illustrated in FIG. 5. FIG. 5A is a schematic diagram showing a single resonator 30 which is added with mass at both ends of the coil spring 30*a*. FIG. 5B is the schematic diagram showing the amplitude distribution of each part when the resonator 30 shown in FIG. 5A resonates.

Figures 5A, 5B, 5C, 5D, 5E, 5F:
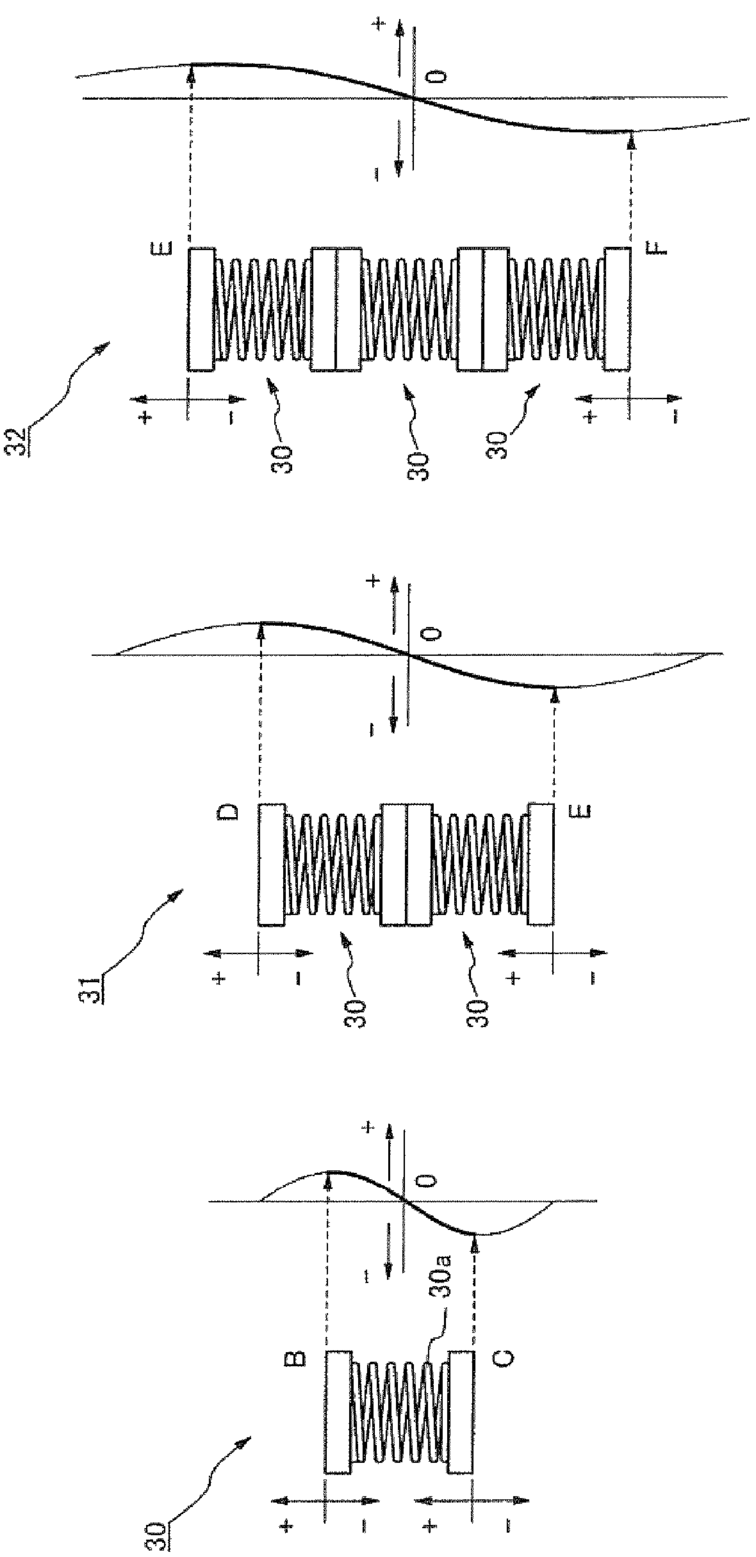
FIG. 5A is a schematic diagram which describes a principle of a low frequency oscillator according to an exemplary embodiment of the present invention by using a single resonator.
FIG. 5B shows an amplitude distribution of the resonator shown in FIG. 5A.
FIG. 5C is a schematic diagram which describes a principle of a low frequency oscillator according to an exemplary embodiment of the present invention by using two resonators.
FIG. 5D shows an amplitude distribution of the resonators shown in FIG. 5C.
FIG. 5E is a schematic diagram which describes a principle of a low frequency oscillator according to an exemplary embodiment of the present invention by using three resonators.
FIG. 5F is an amplitude distribution of the resonators shown in FIG. 5E.

When an end face B is displaced in a direction of + (plus), an end face C is displaced in a direction of − (minus), and thus the whole of the resonator 30 shown in FIG. 5A is expanded. Reversely, when the end face B is displaced in the direction of – (minus), the end face C is displaced in the direction of + (plus), and the whole of it shrinks. In this way, the resonator 30 performs the elastic operation. Such resonator 30 shows a half of amplitude distribution of a sinusoidal wave as shown in FIG. 5B when resonating and it will causes a so-called half-wavelength resonance by which the amplitude of vibration of the end face becomes maximum. A resonator 31 shown in FIG. 5C is fabricated by connecting two such resonators 30. A resonator 32 shown in FIG. 5E is fabricated by connecting three such resonators 30.

The resonators 31 with two resonators 30 shown in FIG. 5C and the resonators 32 with three resonators 30 shown in FIG. 5E vibrate as a whole, respectively. Therefore, they vibrate with the amplitude distribution as shown in FIG. 5D and FIG. 5F, respectively, and these resonant frequencies are ½ and ⅓ respectively compared with the resonance frequency when the resonator 30 is single as shown in FIG. 5A. Based on such principle, when the resonance frequency of one of the drum-shaped oscillator (1*a*, 1*b* and 1*c*) is set to be f0, because three of the drum-shaped oscillators are mechanically connected, the whole resonance frequency will be (⅓) f0, and the low frequency oscillator 1 of this exemplary embodiment shown in FIG. 1 can generate a sound wave with further lowered frequency.

When making each plate-shaped vibrator independent, as in conventional way, frequency of each plate-shaped vibrator has to be lowed respectively. In case of such plate-shaped vibrator, the resonance frequency will be 1/n theoretically when setting the length of the plate to n times. However, when the length is n times, its strength declines substantially, and cannot be served to the practical use. It will be also difficult for an actual production. In the disk transducer, although the resonance frequency will be 1/n when setting the diameter to n times, the area will be 2n times and the weight is also 2n times.

In contrast, in the low frequency oscillator according to the exemplary embodiment of the present invention, lowered frequency can be made easily and the very firm strength will be obtained much smaller size and weight saving are realized.

As is described above, the low frequency oscillator according to the exemplary embodiment of the present invention includes a plurality of drum-shaped oscillators 1*a*, 1*b* and 1*c* in which the cylindrical disk-shaped flexural vibrators 2*a* and 2*b* are provided on both ends 7*a* and 7*b* of the metal cylinder 7. Because each of the drum-shaped oscillators 1*a*, 1*b* and 1*c* is small and firm, and they are arranged to be connected each other on the center axis 6, it is easy to lower its frequency with very firm structure. The length of the low frequency oscillator of the present invention can be made short compared with the case that a plate-shaped rectangular vibrator is used. Moreover, the diameter of the low frequency oscillator of the present invention can be made extremely small compared with the case that only one cylindrical disk-shaped transducer is used. As a result, the low frequency oscillator of the present invention can achieve the small and light-weight structure with improved bending property of the transducer.

[Exemplary Embodiment of an Omni-directional Type Low Frequency Underwater Acoustic Transducer]

Figure 6:
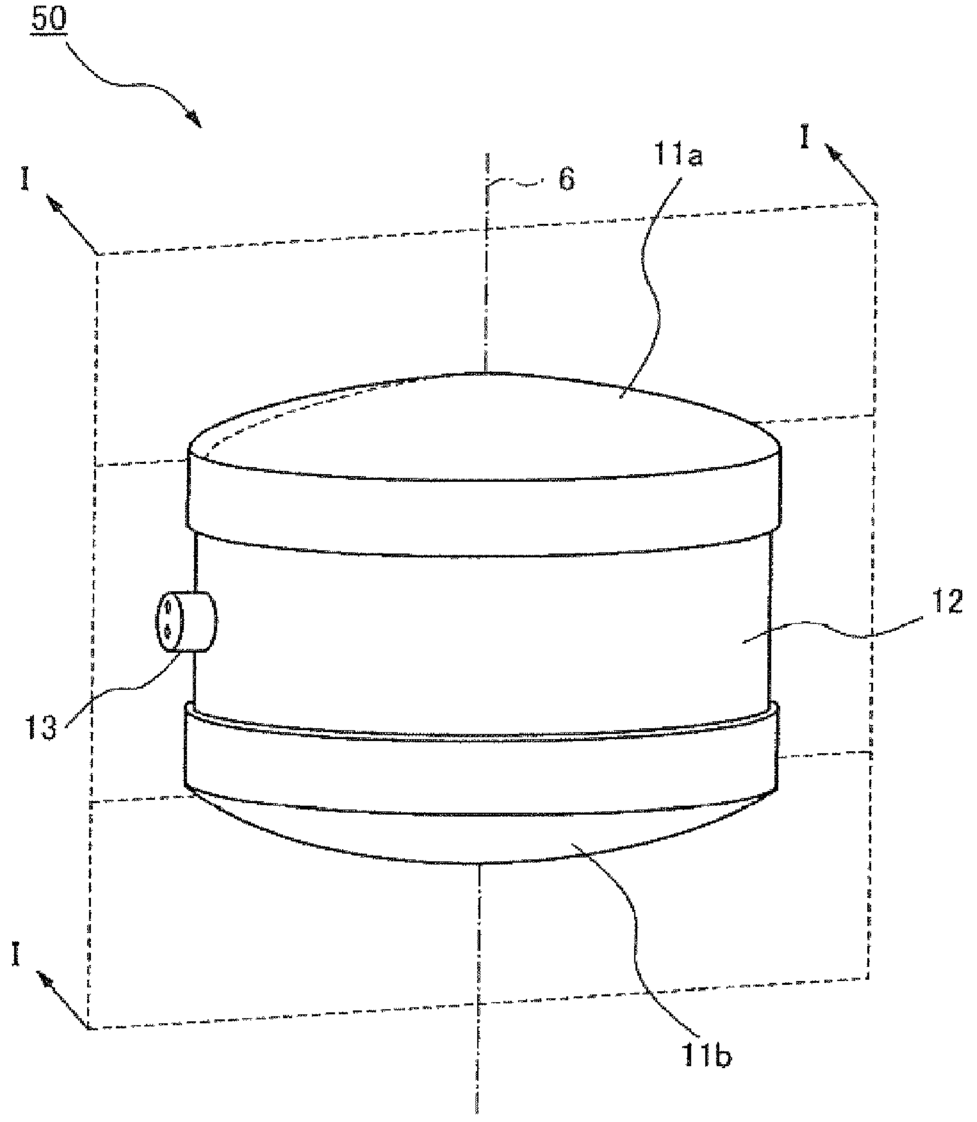
FIG. 6 is a schematic perspective view showing an omni-directional type low frequency underwater acoustic transducer according to an exemplary embodiment of the present invention.
Figure 7:
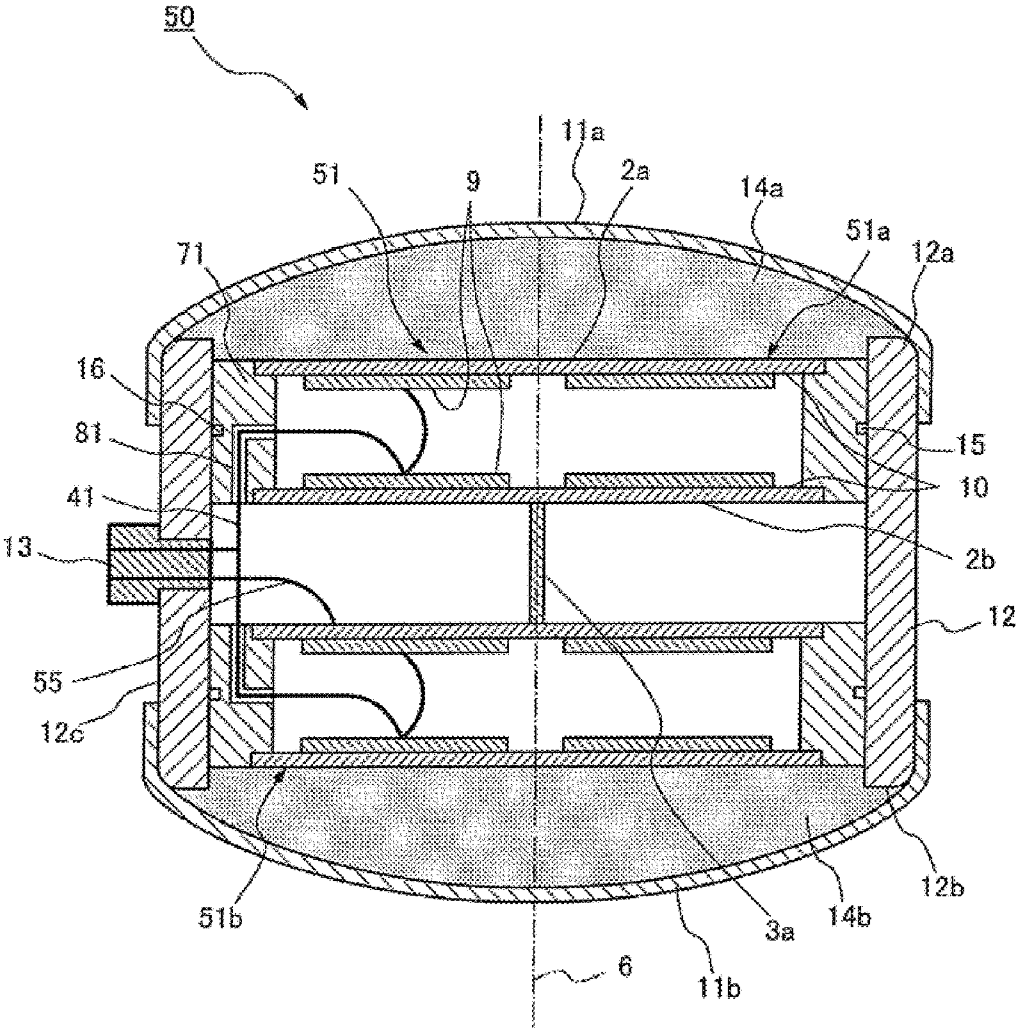
FIG. 7 is a cross sectional view taken along the I-I-I plane shown in FIG. 6.

An omni-directional type low frequency underwater acoustic transducer 50 of this exemplary embodiment will be described in detail in the followings by referring FIG. 6 and FIG. 7. In FIG. 6, a perspective view of the omni-directional type transducer is shown where the low frequency oscillator according to the present invention mentioned above is used for it. FIG. 7 is a cross sectional view taken along the I-I-I plane shown in FIG. 6.

In the following description, the same reference numeral are used for the configuration common to the low frequency oscillator according to above mentioned exemplary embodiment, and the detailed description thereof is omitted.

The omni-directional type transducer 50 of this exemplary embodiment includes the above-mentioned low frequency oscillator 1 shown in FIG. 1.

And further including an elastic sliding ring 16 attached to an annular groove 15 formed on an outer wall of the metallic cylinder 71 which is arranged outer most positions of the coupling array of the drum-shaped oscillators 51*a* and 51*b*. The coupling array of the drum-shaped oscillators 51*a* and 51*b* is housed in a cylindrical case 12 coaxially, which has an inner wall fitted to the elastic sliding ring 16 so as to seal a space formed among the cylindrical case 12 and the drum-shaped oscillators 51*a* and 51*b*. The cylindrical case 12 can be made of either conductive material or insulative material. When Further, a pair of hemispherical acoustic rubber covers 11*a* and 11*b* is attached to both open ends of the cylindrical case 12 so as to provide a pair of sealed spaces, and acoustic oil or insulating oil such as castor oil 14*a* and 14*b* are filled in the sealed spaces.

Because the omni-directional type transducer 50 of this illustrated example includes the two drum-shaped oscillators 51*a* and 51*b* which are constructed and arranged on a direction of the center axis 6, both of the transducers 51*a* and 51*b* are placed on outer, most position in the direction of the center axis 6.

Further, the omni-directional type transducer 50 shown in FIG. 6 and FIG. 7 is constructed such that a water tight type connector 13 is provided on a side wall 12*c* of the cylindrical case 12.

As shown in FIG. 7, the drum-shaped oscillators 51*a* and the drum-shaped oscillators 51*b* are connected each other by using the coupling member 3*a* to provide the low frequency oscillator 51, and it is installed within a cylindrical case 12. Each of the drum-shaped oscillators 51*a* and 51*b* includes a metal cylinder 71. An outer side wall 71*c* of the metal cylinder 71 is provided with an annular groove 15 which is formed as circle around the metal cylinder 71 to accommodate an elastic sliding ring 16. The signal line 41 for the drum-shaped oscillators 51*a* and 51*b* is drawn out through a hole 81 formed in the metal cylinder 71 for pulling out the signal line like the signal line 4 of the low frequency oscillator 1 shown in FIG. 2, and it is connected to the water tight connector 13.

As shown in FIG. 6 and FIG. 7, both ends 12*a* and 12*b* of the cylindrical case 12 made of insulative material are covered and sealed with acoustic elastic and stretchable covers such as rubber covers 11*a* and 11*b*, respectively, and acoustic oil 14*a* and 14*b* are injected into spaces formed between the drum-shaped oscillators 51*a* and 51*b* and the acoustic rubber covers 11*a* and 11*b* to fill them, respectively. The drum-shaped oscillators 51*a* and 51*b* attached with the elastic sliding rings 16 can keep the sealing for the filled acoustic oil even when the drum-shaped oscillators 51*a* and 51*b* slide inside the cylindrical case 12.

Next, the operation of the omni-directional type low frequency underwater acoustic transducer 50 having the structure mentioned above will be described based on the schematic diagram illustrated on FIG. 10 (FIG. 7 is also referred to). FIG. 10A, FIG. 10B and FIG. 10C are the schematic diagrams corresponding to the low frequency oscillators shown in FIG. 4A, FIG. 4B and FIG. 4C respectively. FIG. 10A is a schematic cross section which indicates a state of the omni-directional type 50 when the voltage applied to the signal line 41 is zero, FIG. 10B is a state when the voltage applied to the signal line 41 is positive, and FIG. 10C is a state when the voltage applied to the signal line 41 is negative, respectively.

Figures 10A, 10B, 10C:
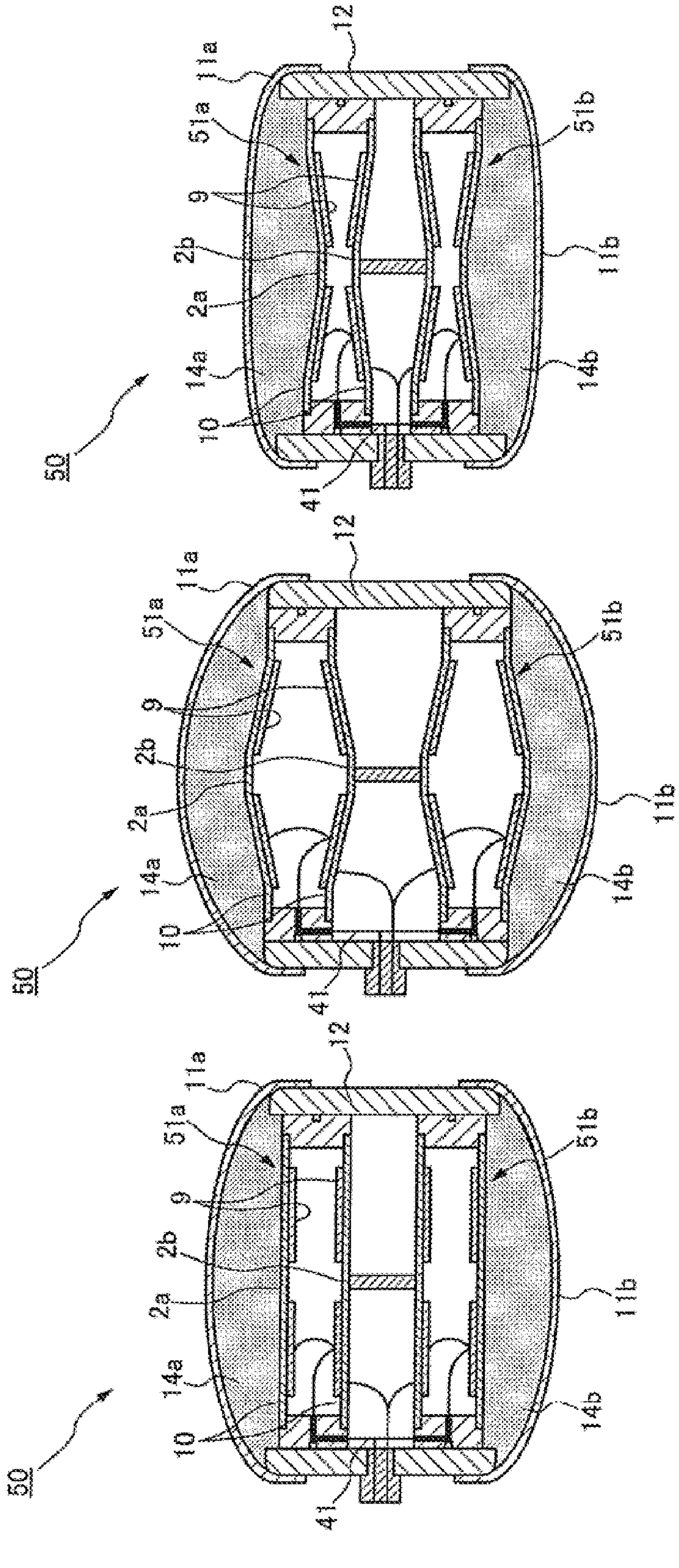
FIG. 10A is a cross sectional view which describes an operational principle of the omni-directional type low frequency underwater acoustic transducer according to an exemplary embodiment of the present invention.
FIG. 10B is a schematic cross sectional view showing a state of the omni-directional type low frequency underwater acoustic transducer shown in FIG. 10A when a voltage applied to a signal line thereof is positive.
FIG. 10C is a schematic cross sectional view showing a state of the omni-directional type low frequency underwater acoustic transducer shown in FIG. 10A when a voltage applied to the signal line thereof is negative.

In FIG. 10B, because the positive voltage is applied to the doughnut-shaped thin plate piezoelectric vibrators 9 of the drum-shaped oscillators 51*a* and 51*b*, the diameter of the piezoelectric vibrator 9 is increased. Thus, each of the drum-shaped oscillators 51*a* and 51*b* swells and slides outwardly along inner wall of the cylindrical case 12, and thereby swelling the hemispherical acoustic rubber covers 11*a* and 11*b* which cover the space where the acoustic oil 14*a* and 14*b* are filled. On the other hand, in FIG. 10C, because the negative voltage is applied to the piezoelectric vibrators 9 of the drum-shaped oscillators 51*a* and 51*b*, the diameter of the piezoelectric vibrator 9 is decreased. Thus, each of the drum-shaped oscillators 51*a* and 51*b* shrinks and slides inwardly along inner wall of the cylindrical case 12, and thereby shrinking the hemispherical acoustic rubber covers 11*a* and 11*b*. An operation system for the omni-directional type 50 of this exemplary embodiment is similar to the low frequency oscillator 1 mentioned above.

According to the omni-directional type transducer 50 of this exemplary embodiment described above, the hemispherical acoustic rubber covers 11*a* and 11*b* swell or shrink depend on the polarity of the voltage applied to the signal line 41. As a result, the sound wave of the omni-directional can be transmitted or received by the rubber covers 11*a* and 11*b*. Because the omni-directional type transducer 50 of this exemplary embodiment is fabricated by using the low frequency oscillator according to the above-mentioned present invention, its acoustic frequency can be extremely lowered, and a firm and light-weight structure can be also realized.

[Exemplary Embodiment of a Cylindrical Radiation Type Low Frequency Underwater Acoustic Transducer]

Figure 8:
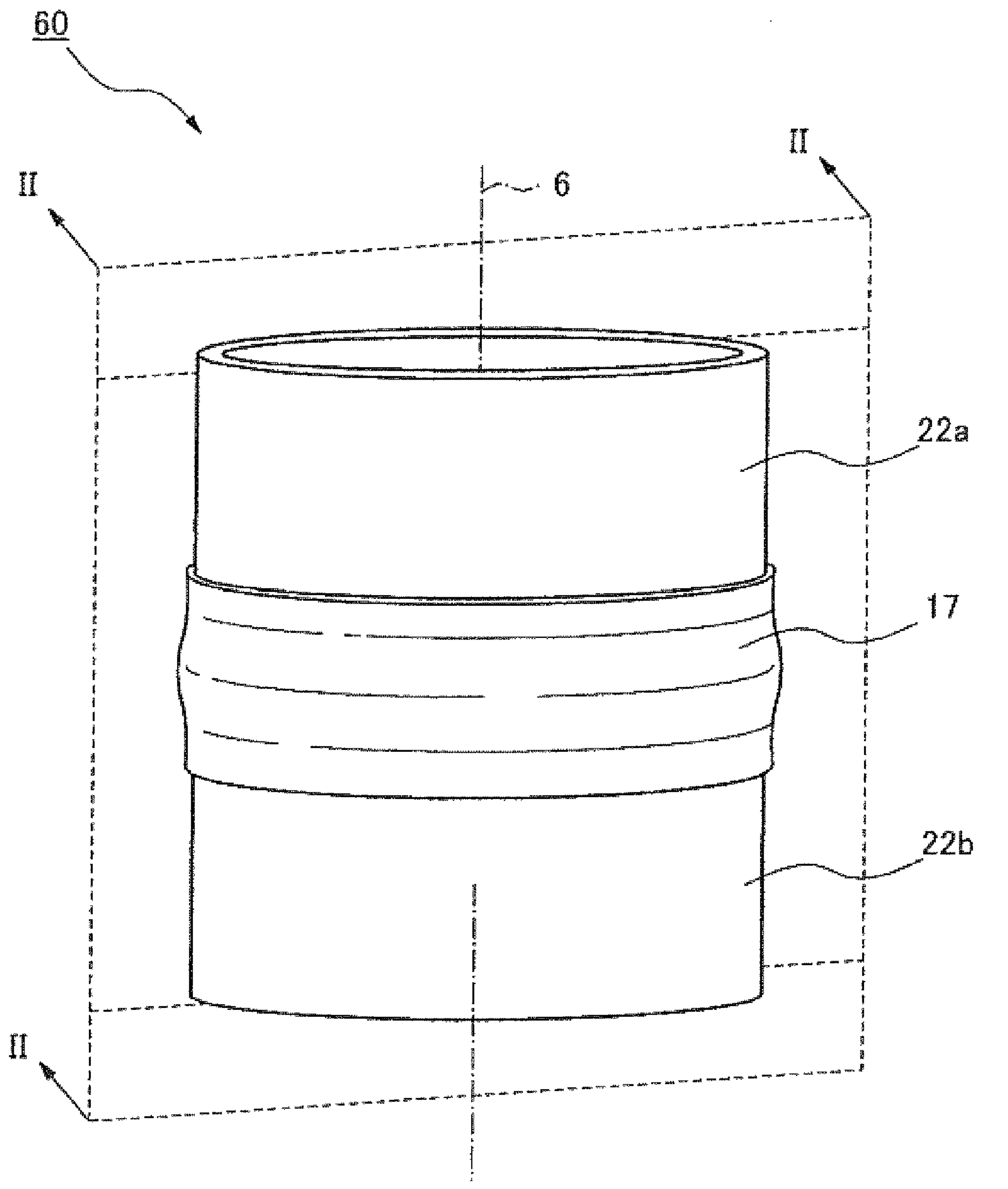
FIG. 8 is a schematic perspective view showing a cylindrical radiation type low frequency underwater acoustic transducer according to an exemplary embodiment of the present invention.
Figure 9:
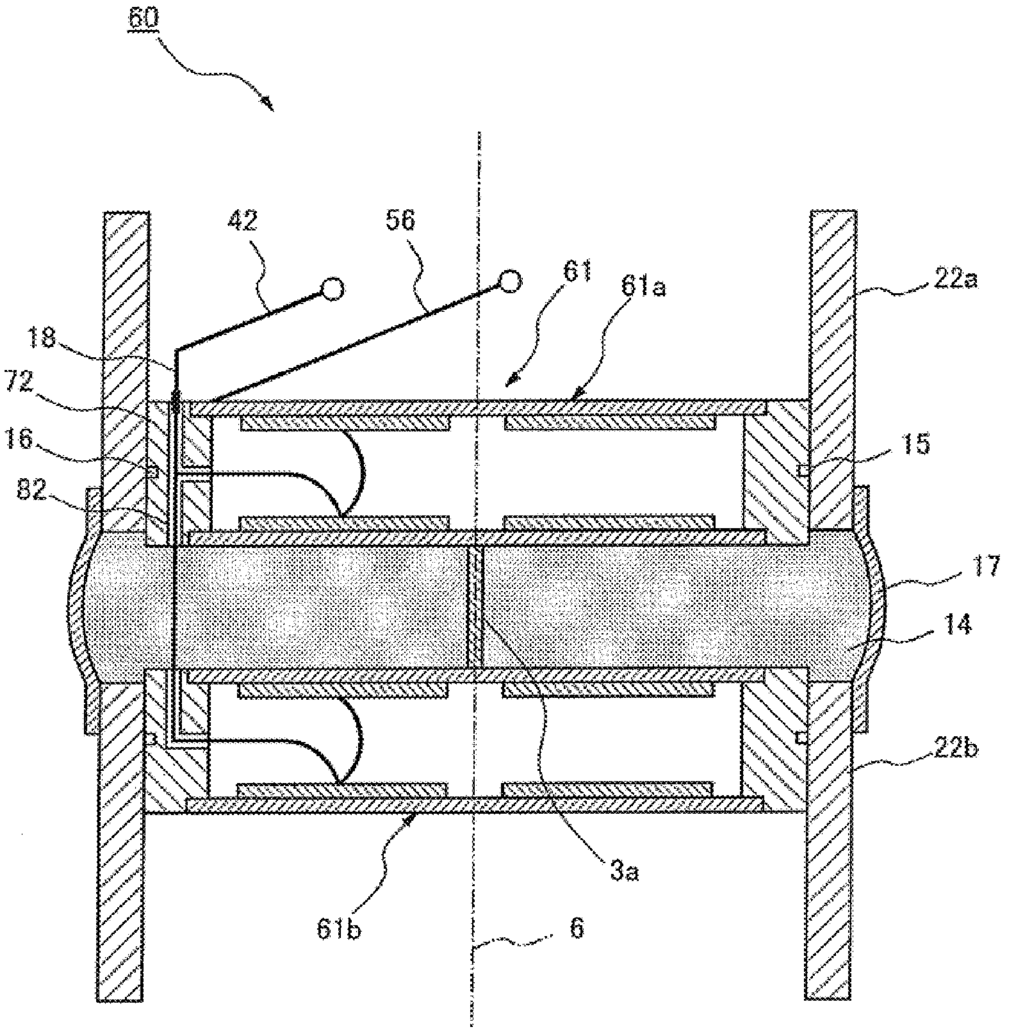
FIG. 9 is a cross sectional view taken along the II-II-II plane shown in FIG. 8.

The cylindrical radiation type transducer 60 of this exemplary embodiment will be described in detail as follows referring to FIG. 8 and FIG. 9. In FIG. 8, a perspective view of the cylindrical radiation type transducer is shown where the low frequency oscillator according to the present invention mentioned above is used for it. FIG. 9 is a cross sectional view taken along the II-II-II plane shown in FIG. 8.

In the following description, the same reference numeral are used for the configuration common to the low frequency oscillator or the omni-directional type transducer according to above mentioned exemplary embodiment, and the detailed description thereof is omitted.

The cylindrical radiation type transducer 60 of this exemplary embodiment includes the above-mentioned low frequency oscillator 1 shown in FIG. 1. And further including an elastic sliding ring 16 attached to an annular groove 15 formed on an outer wall of the metallic cylinder 72 which is arranged outer most positions of the coupling array of the drum-shaped oscillators 61*a* and 61*b*. The pair of the drum-shaped oscillators 61*a* and 61*b* arranged outer most positions of the coupling array of the drum-shaped oscillators 61*a* and 61*b* are respectively housed in a pair of cylindrical cases 22*a* and 22*b* coaxially. Each of the cylindrical cases 22*a* and 22*b* has an inner wall so as to be fitted to the elastic sliding ring 16 so that the drum-shaped oscillators 61*a* and 61*b* having the elastic sliding ring 16 are enabled to slide within the cylindrical cases 22*a* and 22*b* without breaking sealing therebetween. The cylindrical cases 22*a* and 22*b* can be made of either conductive material or insulative material. In addition, a cylindrical acoustic rubber cover 17 is attached to opposing open ends of the pair of cylindrical cases 22*a* and 22*b* so as to provide a sealed space therein and thereby covering the coupling array of the drum-shaped oscillators 61*a* and 61*b*, and acoustic oil 14 is filled in the sealed space.

As shown in FIG. 9, the drum-shaped oscillators 61*a* and the drum-shaped oscillators 61*b* are mechanically and electrically connected each other by using the coupling member 3*a* to provide a low frequency oscillator 61 and they are installed within cylindrical cases 22*a* and 22*b*, respectively. These cylindrical cases 22*a* and 22*b* are coupled together with a cylindrical acoustic rubber cover 17. Each of the drum-shaped oscillators 51*a* and 51*b* includes a metal cylinder 72. An outer side wall of the metal cylinder 72 is provided with a annular groove 15 which is formed as a circle around the metal cylinder 72 to accommodate an elastic sliding ring 16. The signal line 42 for the drum-shaped oscillators 61*a* and 61*b* is drawn out through a hole 82 formed in the metal cylinder 72 for pulling out the signal line 42 in the same manner of the signal line 4 of the low frequency oscillator 1 shown in FIG. 2 or the signal line 41 of the omni-directional type transducer 50 shown in FIG. 7, and it is connected to a sealing terminal 18.

A ground line 52 is connected to a metal portion of the drum-shaped oscillator 61*a*, e.g., the cylindrical case 22*a* in FIG. 9, and thus the ground line 52 is electrically connected to the cylindrical disk-shaped flexural vibrator 2 of the drum-shaped oscillator 61*b* via the coupling member 3*a*.

As shown in FIG. 9, a sealed space is provided within a pair of the cylindrical cases 22*a* and 22*b* and the cylindrical acoustic rubber cover 17 together with a combination of the elastic sliding ring 16 on the drum-shaped oscillators 61*a* and 61*b* and the sealing terminal 18. The acoustic oil 14 is filled into this space.

Next, the operation of the cylindrical radiation type transducer 60 having the structure mentioned above will be described based on the schematic diagram illustrated in FIG. 11 (also refer to FIG. 9). FIG. 11A, FIG. 11B and FIG. 11C are the schematic diagrams corresponding to the low frequency oscillator shown in FIG. 4A, FIG. 4B and FIG. 4C, respectively. FIG. 11A is a schematic cross sectional view showing a state that the cylindrical radiation type transducer 60 when the voltage applied to the signal line 42 is zero, while FIG. 11B shows a state when a positive voltage is applied to the signal line 42, and FIG. 11C shows a state when a negative voltage is applied to the signal line 42.

Figures 11A, 11B, 11C:
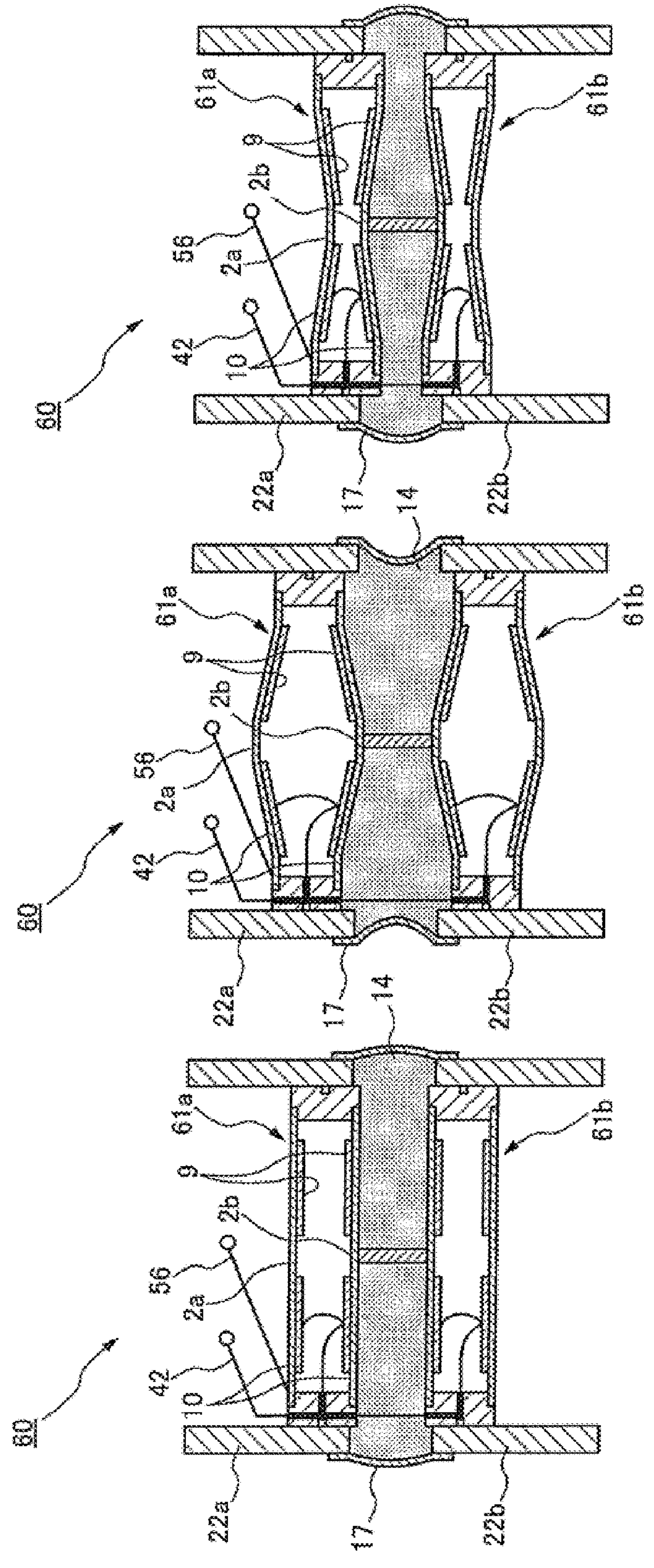
FIG. 11A is a cross sectional view which describes an operational principle of the cylindrical radiation type low frequency underwater acoustic transducer according to an exemplary embodiment of the present invention.
FIG. 11B is a schematic cross sectional view showing a state of the cylindrical radiation type low frequency underwater acoustic transducer shown in FIG. 11A when a voltage applied to a signal line thereof is positive.
FIG. 11C is a schematic cross sectional view showing a state of the cylindrical radiation type low frequency underwater acoustic transducer shown in FIG. 11A when a voltage applied to the signal line thereof is negative.

In FIG. 11B, because the positive voltage is applied to the piezoelectric vibrators 9 of the drum-shaped oscillators 61*a* and 61*b*, the diameter of the piezoelectric vibrator 9 is increased. Thus, each of the drum-shaped oscillators 61*a* and 61*b* swells and slides outwardly along inner wall of the cylindrical case 22*a* and 22*b*, respectively, and thereby shrinking the cylindrical acoustic rubber cover 17 by increasing the space where acoustic oil 14 is filled. On the other hand, in FIG. 11C, because the negative voltage is applied to the piezoelectric vibrators 9 of the drum-shaped oscillators 61*a* and 61*b*, the diameter of the piezoelectric vibrator 9 is decreased. Thus, each of the drum-shaped oscillators 61*a* and 61*b* shrinks and slides inwardly along inner wall of the cylindrical case 22*a* and 22*b*, respectively, and thereby swelling the cylindrical acoustic rubber cover 17 by decreasing the space where the acoustic oil 14 is filled. An operation system for the cylindrical radiation type transducer 60 of this exemplary embodiment is similar to the low frequency oscillator 1 mentioned above.

According to the cylindrical radiation type transducer 60 of this exemplary embodiment described above, the cylindrical acoustic rubber cover 17 shrink or swell depend on the polarity of the voltage applied to the signal line 42. As a result, the sound wave of the omni-directional can be transmitted or received by the cylindrical acoustic rubber cover 17. Because the cylindrical radiation type transducer 60 of this exemplary embodiment is fabricated by using the low frequency oscillator according to the above-mentioned present invention, its acoustic frequency can be extremely lowered, and a firm and light-weight structure can be also realized.

Figure 12B:
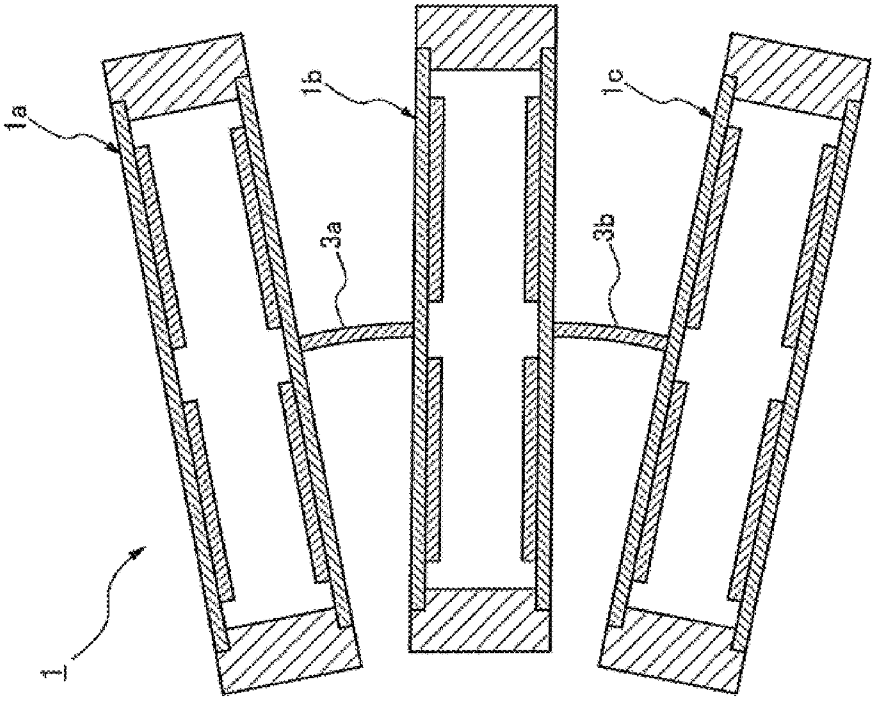
FIG. 12B is a schematic cross sectional view showing a state that the low frequency oscillator shown in FIG. 12A is bended when the external force is applied thereto.
Figure 12A:
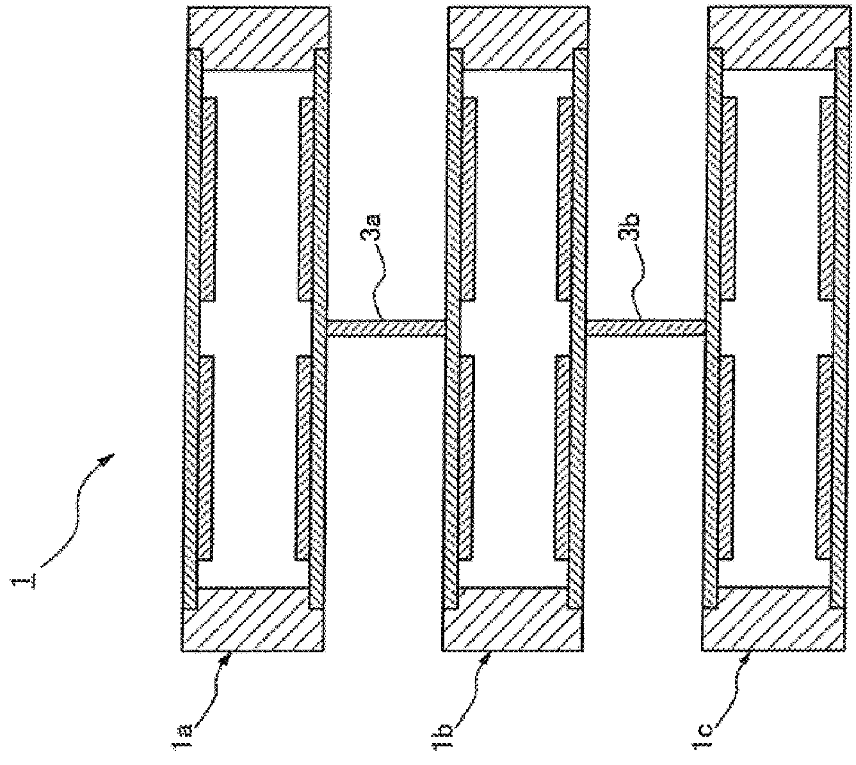
FIG. 12A is a schematic cross sectional view showing a state of a low frequency oscillator according to an exemplary embodiment of the present invention when external force is not applied thereto.

FIG. 12 is a schematic diagram illustrating a bending state of the low frequency oscillator according to an exemplary embodiment of the present invention. FIG. 12A shows a state that an external force is not applied to the transducer while FIG. 12B shows a bended state of the transducer when the external force is applied to the transducer.

The low frequency oscillator according to an exemplary embodiment of the present invention has a structure that the vibrating surfaces of the cylindrical disk-shaped flexural vibrators of the drum-shaped oscillators are connected by using the conductive elongated coupling member. As an example of this conductive elongated coupling member, a rod-like metal or rigid metal wire such as a piano wire which possesses a resilient (spring) characteristics can be used, preferably a copper-coated piano wire is used so as to provide a good electric conductivity together with strength. Accordingly, owing to resilience of the conductive elongated coupling member and the vibrating surface of the cylindrical disk-shaped flexural vibrator, the low frequency oscillator of the present invention has a structure that can bend easily as shown in FIG. 12B. Such bending ability can be effective in the cylindrical radiation type transducer 60 of this exemplary embodiment mentioned above, and thus easily accomplish an excellent transducer in its bending capability.

The method of manufacturing the low frequency oscillator, the omni-directional type transducer, and the cylindrical radiation type transducer according to the present invention will be described hereinafter, referring to drawings appropriately.

When the low frequency oscillator 1 according to the present invention as shown in FIG. 1 and FIG. 2 is manufactured, the cylindrical disk-shaped flexural vibrators 2*a* and 2*b* are made firstly as shown in FIG. 3, by bonding the doughnut-shaped thin plate piezoelectric vibrator 9 and the metal disk 10 together so as to be aligned coaxially with the central point (the center axis 6). In this case, the piezoelectric vibrator 9 is bonded together so that its negative electrode side is faced to the metal disk 10.

Next, as shown in FIG. 2, the signal line 4 is connected to the positive electrode side of the cylindrical disk-shaped flexural vibrator 2*a*, and the cylindrical disk-shaped flexural vibrator 2*a* is attached on the upper end 7*a* of the metal cylinder 7. The signal line 4 is also connected to the positive electrode side of the cylindrical disk-shaped flexural vibrator 2*b*. After inserting the signal line 4 into the hole 8 for pulling out the signal line, the cylindrical disk-shaped flexural vibrator 2*b* is attached on the bottom end 7*b* of the metal cylinder 7. The drum-shaped oscillator 1*a* is manufactured via such steps.

As shown in FIG. 2, it is preferable to arrange the doughnut-shaped thin plate piezoelectric vibrator 9 spaced apart from the metal cylinder 7, while the metal disk 10 is arranged so as to be supported by the metal cylinder 7. More specifically, an outer diameter of the doughnut-shaped thin plate piezoelectric vibrator 9 is designed to be smaller than an inner diameter of the metal cylinder 7 while a diameter of the metal disk 10 is preferably smaller than an outer diameter of the metal cylinder 7 so as to be located within a step portion thereof so as to form a flat plane between therebetween as shown in FIG. 2. A diameter of each of the conductive elongated coupling members 3*a* and 3*b* is smaller than an inner diameter of the doughnut-shaped thin plate piezoelectric vibrator 9.

And the drum-shaped oscillators 1*b* and 1*c* manufactured by the same manner are electrically connected with the conductive elongated coupling member 3*a* by using such method as bonding or welding. As a result, the signal line 4 of the drum-shaped oscillators 1*a*, 1*b* and 1*c* are electrically and mechanically connected each other, and the ground line 5 is connected to one of metal portions of the drum-shaped oscillators 1*a*, 1*b* and 1*c*, and then the low frequency oscillator 1 is obtained.

Next, the method of manufacturing the omni-directional type low frequency underwater acoustic transducer 50 according to the present invention as shown in FIG. 6 and FIG. 7 will be described.

First, the low frequency oscillator of which the omni-directional type transducer 50 is composed is made by the same method as the above-mentioned. In this case, the low frequency oscillator 51 including the drum-shaped oscillators 51*a* and 51*b* is made as shown in FIG. 7. The drum-shaped oscillators 1*a* and 1*b* use the metal cylinder 71 provided with an annular groove 15 on the outer wall thereof. When three or more of the drum-shaped oscillators are connected to manufacture the low frequency oscillator, outermost two drum-shaped oscillators in the direction of the center axis 6 respectively include the metal cylinder 71 with the annular groove 15, while the other drum-shaped oscillator uses the metal cylinder which has an outside diameter smaller than that used for outermost two drum-shaped oscillators.

Next, the elastic sliding ring 16 is put in the annular groove 15 of the drum-shaped oscillators 51*a* and 51*b*, and then the low frequency oscillator 51 as a whole is slipped into the cylindrical case 12. After connecting the signal line 41 and the ground line 55 to the water tight connector 13, the connector 13 is installed in the cylindrical case 12.

Next, the hemispherical acoustic rubber covers 11*a* and 11*b* are attached to the cylindrical case 12 such that the both ends 12*a* and 12*b* of the cylindrical case 12 are covered with the rubber covers 11*a* and 11*b*, respectively, and the acoustic oil 14*a* and 14*b* are injected therein to fill it. As an example of the injection method of the acoustic oil 14*a* and 14*b*, the hemispherical acoustic rubber covers 11*a* and 11*b* are attached to the cylindrical case 12 in which the low frequency oscillator 51 is included during the both ends 12*a* and 12*b* of the cylindrical case 12 is soaked in the acoustic oil. But the injection method is not limited to particular one and any other method can be adopted appropriately.

Although detailed description and illustration are omitted in this exemplary embodiment, it is desirable to fasten the hemispherical acoustic rubber covers 11*a* and 11*b* to the cylindrical case 12 by using belt or the like from outside so that the acoustic oil 14*a* and 14*b* within the rubber covers 11*a* and 11*b* do not begin to leak out.

By using the above-mentioned method, the omni-directional type transducer 50 of this exemplary embodiment is obtained.

Next, the method of manufacturing the cylindrical radiation type transducer 60 according to the present invention as shown in FIG. 8 and FIG. 9 will be described.

First, the low frequency oscillator of which the cylindrical radiation type transducer is composed is made by the same method as the above-mentioned, in this case, the low frequency oscillator 61 including the two drum-shaped oscillators 61*a* and 61*b* is made as shown in FIG. 9. Like the omni-directional type low frequency underwater acoustic transducer mentioned above, each of the transducers 61*a* and

61*b* uses the metal cylinder 72 provided with the annular groove 15 on the outer wall thereof.

Next, the elastic sliding ring 16 is put in the annular groove 15 of the drum-shaped oscillators 61*a* and 61*b*, and the drum-shaped oscillator 61*a* is slipped into the cylindrical case 22*a* while the drum-shaped oscillator 61*b* is slipped into the cylindrical case 22*b*. The signal line 42 is connected to the sealing terminal 18, and the ground line 56 is connected to the metal portion of the drum-shaped oscillator 61*a*, e.g., the metal cylinder 72 in FIG. 9, and thus the ground line 56 is electrically connected to the cylindrical disk-shaped flexural vibrators 2*a* and 2*b* of the drum-shaped oscillator 61*a* and 61*b* through metal cylinder 72 and the conductive elongated coupling member 3*a*.

And the cylindrical acoustic rubber cover 17 is attached between the cylindrical case 22*a* and the cylindrical case 22*b*, and the acoustic oil 14 is injected into it to fill it.

By using the above-mentioned method, the cylindrical radiation type transducer 60 of this exemplary embodiment is obtained.

In the foregoing exemplary embodiments, as an example of the low frequency oscillator, three drum-shaped oscillators 1*a*, 1*b* and 1*c* are used for the low frequency oscillator 1 as shown in FIG. 1 and FIG. 2. As to the omni-directional type low frequency underwater acoustic transducer 50 shown in FIG. 6 and FIG. 7 and the cylindrical radiation type low frequency underwater acoustic transducer 60 shown in FIG. 8 and FIG. 9, two drum-shaped oscillators are used as an example. However, the present invention is not limited to those configurations.

For example, the number of the low frequency oscillator of the present invention and the drum-shaped oscillators used for the omni-directional type transducer and the cylindrical radiation type transducer is not limited to the above-mentioned structure, i.e., n-numbers of drum-shaped oscillators are connected along a straight line by using (n−1)-numbers of the conductive elongated coupling members, and it can be determined appropriately.

As examples of the utilization of the low frequency oscillator of the present invention, the omni-directional type transducer, and the cylindrical radiation type transducer using that, for example, the small acoustic source buoy which is used in the water and the linear array or the like towed from the shipping are available, and it can be adopted appropriately.

In a rod-shaped transducer such as cylindrical and prismatic, when two transducers are connected each other, each having length of L and resonance frequency of f0, a resulted resonance frequency will be (½) f0 with the length of 2 L, and therefore, when n-numbers transducers are connected, the resulted resonance frequency will be (1/n)f0. Based on such principle, the resonance frequency of the low frequency oscillator of the present invention that connected the drum-shaped oscillators by the conductive elongated coupling member will be inverse proportion to the number of the drum-shaped oscillators.

When making each plate-shaped vibrator independent, as in conventional way, frequency of each plate-shaped vibrator has to be lowed respectively. In case of such plate-shaped vibrator, the resonance frequency will be 1/n theoretically when setting the length of the plate to n times. However, when the length is n times, its strength declines substantially, and cannot be served to the practical use. It will be also difficult for an actual production. In the disk transducer, although the resonance frequency will be 1/n when setting the diameter to n times, the area will be 2n times and the weight is also 2n times.

In contrast, according to the low frequency oscillator of the present invention, because each of the small and firm drum-shaped oscillators will be connected on the center axis, the transducer's strength is very firm and its resonance frequency is easily lowered compared with the plate-shaped vibrator and the disk vibrator, and it allows much smaller and lighter transducer.

According to the omni-directional type transducer of aforementioned structure, the above-mentioned low frequency oscillator is installed inside the cylindrical case such that the elastic sliding ring provided on the outer wall of the metal cylinder of the drum-shaped oscillator which is located outer most position of the array of coupled drum-shaped oscillators enable to seal the inside of the cylindrical case. In addition, both of open ends of the cylindrical case are covered with acoustic hemispherical rubber covers, respectively, so as to seal space formed therein and acoustic oil is filled in the space. As a result, the sound wave of the omni-directional can be effectively transmitted or received by the acoustic hemispherical rubber covers.

According to the cylindrical radiation type transducer of aforementioned structure, the above-mentioned low frequency oscillator is installed inside a pair of cylindrical cases such that the elastic sliding ring provided on the outer wall of the metal cylinder of the drum-shaped oscillator which is located outer most position of the array of coupled drum-shaped oscillators. In addition, the opposing cylindrical cases are covered by a cylindrical acoustic rubber cover so as to fill acoustic oil between the drum-shaped oscillators which are located outer most positions. Accordingly, the sound wave of the omni-directional can be effectively transmitted or received by the outer surface of the cylindrical acoustic rubber cover.

As is described above, the low frequency oscillator according to the exemplary embodiment of the present invention includes a plurality of drum-shaped oscillators in which the cylindrical disk-shaped flexural vibrators are provided on both ends of the metal cylinder. Because each of the drum-shaped oscillators is small and firm, and they are arranged to be connected each other on the center axis, it is easy to lower its frequency with very firm structure. The length of the low frequency oscillator of the present invention can be made short compared with the case that a rectangular plate-shaped vibrator is used. Moreover, the diameter of the low frequency oscillator of the present invention can be made much smaller compared with the case that only one cylindrical disk-shaped transducer is used. As a result, the low frequency oscillator of the present invention can achieve the small and light-weight structure with improved bending property of the transducer.

Because the omni-directional type transducer and the cylindrical radiation type transducer of this exemplary embodiment are fabricated by using the low frequency oscillator according to the above-mentioned present invention, its acoustic frequency can be extremely lowered, and a firm and light-weight structure can be also realized.

Exemplary embodiments of the present invention further includes following oscillator and transducers:

A low frequency oscillator, including:

a plurality of drum-shaped oscillators, each of the drum-shaped oscillators being constructed so that a pair of circular disk-shaped flexural vibrators are attached on both open ends of a metallic cylinder so as to be arranged face to face, each of the disk-shaped flexural vibrators being constructed so that a doughnut-shaped thin plate piezoelectric vibrator and a circular metal disk are bonded together coaxially; and a conductive elongated coupling member fixed to adjacent the drum-shaped oscillators at a central portion thereof so as to electrically connect between adjacent the disk-shaped flexural vibrators and thereby coupling the drum-shaped oscillators along a central axis thereof.

An omni-directional type low frequency underwater acoustic transducer including:

a low frequency oscillator including a plurality of drum-shaped oscillators, each of the drum-shaped oscillators being constructed so that a pair of circular disk-shaped flexural vibrators are attached on both open ends of a metallic cylinder so as to be arranged face to face, each of the disk-shaped flexural vibrators being constructed so that a doughnut-shaped thin plate piezoelectric vibrator and a circular metal disk are bonded together coaxially;

a conductive elongated coupling member fixed to adjacent the drum-shaped oscillators at a central portion thereof so as to electrically connect between adjacent the disk-shaped flexural vibrators and thereby forming a coupling array of the drum-shaped oscillators along a central axis thereof;

an elastic sliding ring attached to an annular groove formed on an outer wall of the metallic cylinder which is arranged outer most positions of the coupling array of the drum-shaped oscillators;

a cylindrical case housing the coupling array of the drum-shaped oscillators coaxially, the cylindrical case having an inner wall fitted to the elastic sliding ring so as to seal a space formed among the cylindrical case and the drum-shaped oscillators;

a pair of hemispherical acoustic rubber covers attached to both open ends of the cylindrical case so as to provide a pair of sealed spaces; and acoustic oil filled in the sealed spaces.

A cylindrical radiation type low frequency underwater acoustic transducer including:

a low frequency oscillator including a plurality of drum-shaped oscillators, each of the drum-shaped oscillators being constructed so that a pair of circular disk-shaped flexural vibrators are attached on both open ends of a metallic cylinder so as to be arranged face to face, each of the disk-shaped flexural vibrators being constructed so that a doughnut-shaped thin plate piezoelectric vibrator and a circular metal disk are bonded together coaxially;

a conductive elongated coupling member fixed to adjacent the drum-shaped oscillators at a central portion thereof so as to electrically connect between adjacent the disk-shaped flexural vibrators and thereby forming a coupling array of the drum-shaped oscillators along a central axis thereof;

an elastic sliding ring attached to an annular groove formed on an outer wall of the metallic cylinder which is arranged outer most positions of the coupling array of the drum-shaped oscillators;

a pair of cylindrical cases housing pair of the drum-shaped oscillators coaxially which is arranged outer most positions of the coupling array of the drum-shaped oscillators, respectively, each of the cylindrical cases having an inner wall so as to be fitted to the elastic sliding ring so that the drum-shaped oscillators having the elastic sliding ring capable to slide within the cylindrical case without breaking sealing therebetween;

a cylindrical acoustic rubber cover attached to opposing open ends of the pair of cylindrical cases so as to provide a sealed space therein and thereby covering the coupling array of the drum-shaped oscillators; and acoustic oil filled in the sealed space.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. An omni-directional type low frequency underwater acoustic transducer comprising:

a low frequency oscillator including a plurality of drum-shaped oscillators, each of said drum-shaped oscillators being constructed so that a pair of disk-shaped flexural vibrators are attached on both open ends of a conductive cylinder so as to be arranged face to face;

a conductive elongated coupling member fixed to adjacent said drum-shaped oscillators at a central portion thereof so as to electrically connect between adjacent said disk-shaped flexural vibrators and thereby forming a coupling array of said drum-shaped oscillators along a central axis thereof;

an elastic sliding ring attached to an annular groove formed on an outer wall of said conductive cylinder which is arranged on outermost positions of said coupling array of said drum-shaped oscillators;

a cylindrical case housing said coupling array of said drum-shaped oscillators coaxially, said cylindrical case having an inner wall fitted to said elastic sliding ring so as to seal a space formed among said cylindrical case and said drum-shaped oscillators;

a pair of acoustic elastic and stretchable covers attached to both open ends of said cylindrical case so as to provide a pair of sealed spaces; and insulating oil filled in said sealed spaces.

2. The omni-directional type low frequency underwater acoustic transducer according to claim 1, wherein each of said disk-shaped flexural vibrators is constructed so that a doughnut-shaped thin plate piezoelectric vibrator and a conductive disk are bonded together coaxially.

3. The omni-directional type low frequency underwater acoustic transducer according to claim 2, wherein each of said drum-shaped oscillators swells or shrinks in response to voltages applied to each of said doughnut-shaped thin plate piezoelectric vibrators.

4. The omni-directional type low frequency underwater acoustic transducer according to claim 1, wherein said elastic and stretchable covers are made of hemispherical acoustic rubber covers.

* * * * *